United States Patent
Kim et al.

(10) Patent No.: US 10,299,391 B2
(45) Date of Patent: May 21, 2019

(54) ROLLABLE DISPLAY DEVICE

(71) Applicant: LG Display Co., Ltd., Seoul (KR)

(72) Inventors: Bong-Chul Kim, Daegu (KR); Jeong-Hun Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 9 days.

(21) Appl. No.: 15/406,610

(22) Filed: Jan. 13, 2017

(65) Prior Publication Data

US 2017/0318689 A1  Nov. 2, 2017

(30) Foreign Application Priority Data

Apr. 29, 2016 (KR) ........................ 10-2016-0053029

(51) Int. Cl.
G09F 9/30 (2006.01)
G03B 21/58 (2014.01)
H05K 5/00 (2006.01)
H05K 1/02 (2006.01)

(52) U.S. Cl.
CPC ........... *H05K 5/0017* (2013.01); *G03B 21/58* (2013.01); *G09F 9/301* (2013.01); *H05K 1/028* (2013.01)

(58) Field of Classification Search
CPC ................................ G09F 9/301; G03B 21/58
USPC ........................................................ 359/461
See application file for complete search history.

(56) References Cited

U.S. PATENT DOCUMENTS 3,592,255 A * 7/1971 Potter .................... G03B 21/58
160/24
5,706,130 A * 1/1998 Rosen .................... G03B 21/58
16/221
6,513,876 B1 * 2/2003 Agler .................... B60N 2/206
297/378.12
8,199,402 B2 6/2012 Abe et al.
8,274,737 B2 9/2012 Wang
8,516,728 B2 8/2013 Jung
8,833,999 B2 9/2014 Wang et al.
8,860,632 B2 10/2014 Kilpatrick et al.
(Continued)

FOREIGN PATENT DOCUMENTS

CN 101036176 A 9/2007
CN 102016716 A 4/2011
(Continued)

OTHER PUBLICATIONS

Office Action for Japanese Patent Application No. JP 2017-020287, dated Jan. 16, 2018, 10 Pages.
(Continued)

*Primary Examiner* — Christopher E Mahoney
(74) *Attorney, Agent, or Firm* — Fenwick & West LLP

(57) ABSTRACT

A rollable display device is provided. The rollable display device may include a flexible display panel, a body including a main roller, around which the flexible display panel is wound, and a link drive unit for moving the flexible display panel, and two link assemblies for connecting the link drive unit and the flexible display panel to each other. Each of the link assemblies may include an upper link frame, a lower link frame, a center link connector, and an elastic plate. The upper link frame and the lower link frame may be coupled to the center link connector independently of each other. The elastic plate may allow the lower link frame to operate later than the upper link frame.

25 Claims, 17 Drawing Sheets

(56) References Cited

U.S. PATENT DOCUMENTS

| | | |
|---|---|---|
| 2007/0241002 A1 | 10/2007 | Wu et al. |
| 2010/0085274 A1 | 4/2010 | Kilpatrick et al. |
| 2011/0026114 A1* | 2/2011 | Abe .................. G03B 21/58 |
| | | 359/461 |

FOREIGN PATENT DOCUMENTS

| | | |
|---|---|---|
| CN | 102150094 A | 8/2011 |
| DE | 102011120277 A1 | 6/2012 |
| JP | H05-224302 | 9/1993 |
| JP | H05-096848 | 12/1993 |
| JP | 2005-215648 | 8/2005 |
| JP | 2006-509249 | 3/2006 |
| JP | 2008-500593 | 1/2008 |
| JP | 2008-516270 | 5/2008 |
| JP | 2010-099122 | 5/2010 |
| JP | 2010-181899 A | 8/2010 |
| JP | 2011-049411 | 3/2011 |
| JP | 2011-253029 | 12/2011 |
| JP | 2012-502321 | 1/2012 |
| JP | 2014-225011 | 12/2014 |
| TW | I283377 B | 7/2007 |
| TW | M403168 U | 5/2011 |
| TW | 201234327 A | 8/2012 |
| TW | I461799 B | 11/2014 |
| WO | WO 2004/053818 | 6/2004 |
| WO | WO 2005/114309 | 12/2005 |
| WO | WO 2006/038171 | 4/2006 |
| WO | WO 2010/028402 | 3/2010 |

OTHER PUBLICATIONS

Taiwan Intellectual Property Office, Office Action, Taiwanese Application No. 106111798, dated Jun. 26, 2018, six pages.
China National Intellectual Property Administration, First Notification of Office Action, CN Patent Application No. 201710080881.6, Jan. 17, 2019.

* cited by examiner

ROLLABLE DISPLAY DEVICE

CROSS-REFERENCE TO RELATED APPLICATION

This application claims the benefit of Republic of Korea Patent Application No. 10-2016-0053029, filed on Apr. 29, 2016, which is hereby incorporated by reference as if fully set forth herein.

BACKGROUND OF THE INVENTION

Field of the Invention

The present invention relates to a rollable display device having a flexible display panel rolled or unrolled as needed.

Discussion of the Related Art

Generally, a display device is an appliance for forming an image. Examples of the display device may include a liquid crystal display device, a plasma display device, and an organic light-emitting display device.

In order to improve portability and spatial utility, the display device may include a flexible display panel. A rollable display device is a display device having a flexible display panel wound around, for example, on a roller or unrolled from the roller in response to a user request. For example, the rollable display device may include a body having a main roller, a flexible display panel wound around the main roller, and two link assemblies for unrolling the flexible display panel. The two link assemblies may be located on the left and right sides of the flexible display panel.

However, in the rollable display device described above, when the two link assemblies are not operated synchronously, the flexible display panel may be momentarily tilted while being rolled or unrolled. When the flexible display panel is tilted during its rolling or unrolling operation, the edge of the flexible display panel may collide with the body in which the flexible display panel is accommodated, which may cause damage to the flexible display panel and/or break the body.

SUMMARY OF THE INVENTION

Embodiments relate to a rollable display device including a body, a flexible display panel, and two link assemblies. The body includes a main roller and a link drive unit. The flexible display panel includes a lower end coupled to the main roller. The flexible display panel winds around the main roller. Each of the two link assemblies includes an upper link frame having an upper end connected to an upper end of the flexible display panel. The lower link frame has a lower end connected to the link drive unit, a center link connector, and an elastic plate fixed to the lower link frame, a lower end of the upper link frame and an upper end of the lower link frame coupled to the center link connector. The elastic plate is disposed on a surface of the lower link frame of one of the two link assemblies facing outward away from the lower frame of the other of the two link assemblies. Each of the two link assemblies collapsing inward as the lower link frame is rotated by the link drive unit to roll the flexible display panel onto the main roller.

In one embodiment, the elastic plate includes a leaf spring.

In one embodiment, a surface of the center link connector facing outward is in contact with the elastic plate when the flexible display panel is completely unrolled.

In one embodiment, the upper end of the elastic plate is lower than the lower end of the upper link frame when the flexible display panel is completely unrolled.

In one embodiment, the center link connector includes a first connection plate disposed close to the flexible display panel, and a second connection plate disposed parallel to the first connection plate. The lower end of the upper link frame and the upper end of the lower link frame are disposed between the first connection plate and the second connection plate.

In one embodiment, the lower end of the upper link frame and the upper end of the lower link frame between the first connection plate and the second connection plate have a width smaller than a width of the other regions of the upper link frame and the lower link frame.

In one embodiment, each of the link assemblies further includes an upper reinforcement frame parallel to the upper link frame, a lower reinforcement frame parallel to the lower link frame, and a center reinforcement connector to which a lower end of the upper reinforcement frame and an upper end of the lower reinforcement frame are coupled independently of each other.

In one embodiment, the center reinforcement connector is coupled to the center link connector.

In one embodiment, the rollable display device further includes an upper holder between the upper end of the flexible display panel and the upper end of the upper link frame, and a back cover including an upper end coupled to the upper holder. The two link assemblies are disposed between the flexible display panel and the back cover.

In one embodiment, the body further includes a cover roller, around which the back cover is wound.

In one embodiment, the rollable display device further includes a first position alignment member on a lower end of the upper holder, and a second position alignment member on the upper link frame. The second position alignment member engages with the first position alignment member when the flexible display panel is completely rolled.

In one embodiment, the first position alignment member is between the flexible display panel and the second position alignment member when the first position alignment member engages with the second position alignment member.

Embodiments relate to a rollable display device including a flexible display panel, a body, and a pair of link assemblies. The flexible display panel includes pixels operated by transistors. The body includes a main roller onto which the flexible display panel is wound from a lower end of the flexible display panel. The pair of link assemblies between the body and an upper end of the flexible display panel, and configured to support the flexible display panel. Each of the link assemblies includes an upper link frame coupled to the upper end of the flexible display panel and a lower link frame coupled between the body and the upper link frame. The upper link frame is rotatable relative to the upper end of the flexible display panel. The lower link frame is rotatable relative to the body and the upper link frame.

In one embodiment, the upper link frame, the lower link frame and the center link connector move parallel to a back surface of the flexible display panel during winding or unwinding of the flexible display panel.

In one embodiment, each of the link assemblies includes at least one center link connector rotatably connecting the upper link frame and a lower link frame, and an elastic plate coupled to the upper link frame or the lower link frame to exert resilient force to the at least one center link connector to sequentially rotate the upper link frame and the lower link frame relative to the center link connector.

In one embodiment, during rolling of the flexible display panel onto the main roller, the center link connector starts to rotate relative to the lower link frame or the upper link after rotation of the upper link frame or the lower link relative to the center link connector is completed.

In one embodiment, the elastic plate is attached to a surface of the upper link frame or the lower link frame and having a flat surface facing a side surface of the at least one center link connector when the rollable display is unrolled. The elastic plate exerts the resilient force to the at least one center link connector by contacting the at least one center link connector through the flat surface.

In one embodiment, each of the link assemblies further includes an upper reinforcement frame parallel to the upper link frame, a lower reinforcement frame parallel to the lower link frame, and a center reinforcement connector rotatably connecting the upper reinforcement frame and the lower reinforcement frame.

In one embodiment, the center reinforcement connector is coupled to the center link connector.

In one embodiment, the rollable display further includes a back cover covering at least a portion of a back surface of the flexible display panel and the pair of the link assemblies.

In one embodiment, the body further includes a cover roller configured to roll or unroll the back cover.

In one embodiment, the rollable display further includes an upper holder extending along the upper end of the flexible display panel, and a holder bracket between the upper holder and the upper link frame. The upper link frame is rotatably connected to the holder bracket.

In one embodiment, the rollable display device further includes a first position alignment member on a lower end of the upper holder, and a second position alignment member on the upper link frame. The second position alignment member engages with the first position alignment member when the flexible display panel is rolled.

In one embodiment, the first position alignment member is disposed between the flexible display panel and the second position alignment member when the first position alignment member engages with the second position alignment member.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Figure 1A:
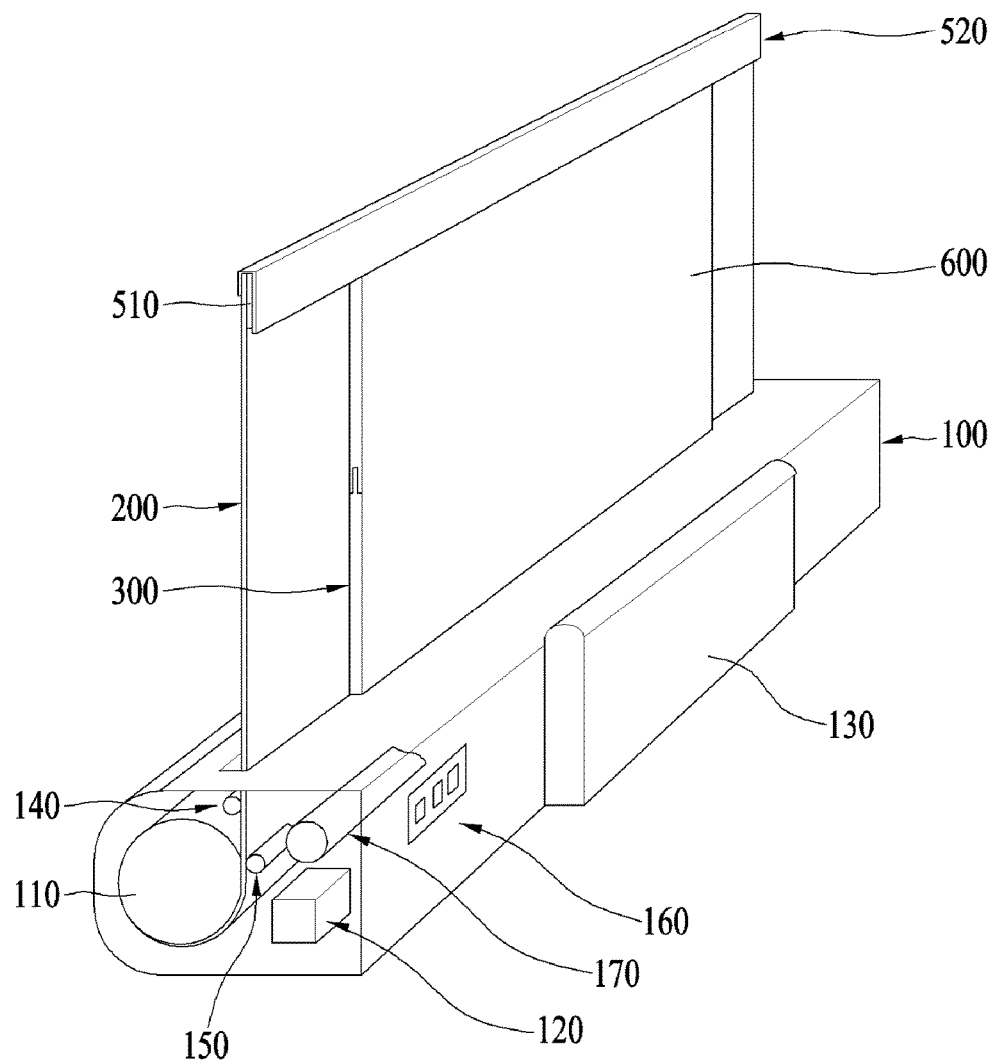
FIG. 1A is a perspective view illustrating a rollable display device according to an embodiment of the present invention.

Hereinafter, details related to the above objects, technical configurations, and operational effects of the present invention will be clearly understood by the following detailed description with reference to the drawings, which illustrate embodiments of the present invention. Here, the embodiments of the present invention are provided in order to allow the technical sprit of the present invention to be sufficiently understood by those skilled in the art, and thus the present invention may be embodied in other forms and is not limited to the embodiments described below.

In addition, the same reference numbers will be used throughout the drawings to refer to the same or like parts. In the drawings, dimensions of layers and regions may be exaggerated for clarity of description. Further, it will be understood that, when a first element is referred to as being "on" a second element, the first element may be directly on the second element or a third element may also be present between the first element and the second element.

Here, terms such as, for example, "first" and "second" are used to describe various elements, and are also used to distinguish any one element from another element. However, "a first element" and "a second element" may be arbitrarily named in a manner convenient to those skilled in the art, without departing from the technical sprit of the present invention.

The terminology used herein is for the purpose of describing particular example embodiments only and is not intended to be limiting. As used herein, the elements expressed in singular forms are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1B:
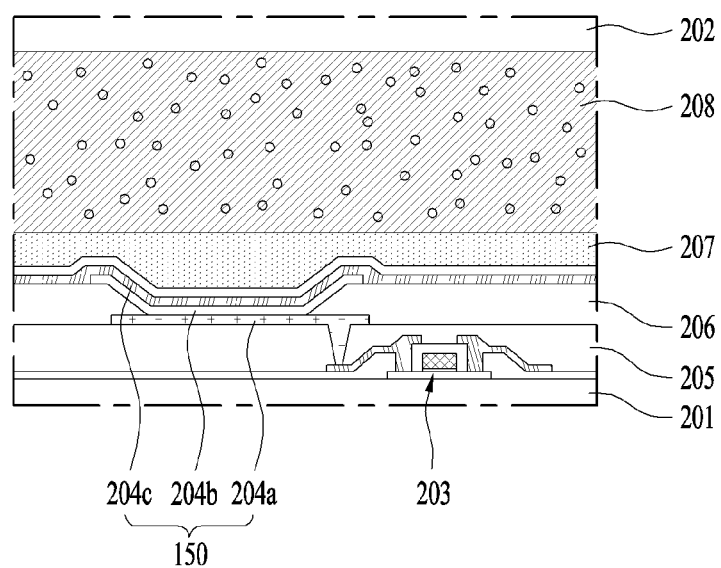
FIG. 1B is a cross-sectional view of the flexible display panel, according to one embodiment.

FIG. 1A is a view illustrating a rollable display device according to an embodiment of the present invention. FIG. 1B is a cross-sectional view of the flexible display panel, according to one embodiment.

Referring to FIGS. 1A and 1B, the rollable display device according to the embodiment of the present invention may include, among other components, a body 100, a flexible display panel 200, link assemblies 300 and a back cover 600.

The body 100 may have a space for accommodating which the flexible display panel 200 and the link assemblies 300. For example, the body 100 may include a main roller 110, for winding the flexible display panel 200, and a link drive unit 120 for operating the link assemblies 300. The body 100 may further include a set power board box 130 that supplies a signal for forming an image on the flexible display panel 200. The set power board box 130 may be disposed on the back surface of the body 100.

The main roller 110 may have a cylindrical shape. The flexible display panel 200 may be wound along the outer surface of the main roller 110. For example, the lower end of the flexible display panel 200 may be coupled to the main roller 110. The main roller 110 may prevent damage to the flexible display panel 200 while it is being rolled and/or unrolled. For example, the body 100 may further include an elastic member for rotating the main roller 110 in the state where the flexible display panel 200 is completely wound. The elastic member may include a spring.

The body 100 may further include auxiliary rollers 140 and 150 for assisting movement of the flexible display panel 200. For example, while the flexible display panel 200 is wound around the main roller 110, the front surface of the flexible display panel 200 may be in contact with the front auxiliary roller 140, and the back surface of the flexible display panel 200 may be in contact with the rear auxiliary roller 150. The front auxiliary roller 140 and the rear auxiliary roller 150 may be located at different circumferential locations of the main roller 110.

The link drive unit 120 may operate the link assemblies 300 so as to move the upper end of the flexible display panel 200 upward or downward. The flexible display panel 200, wound around the main roller 110, may be completely unrolled by the link drive unit 120. The flexible display panel 200, which has been completely unrolled, may be moved toward the main roller 110 by the link drive unit 120. The flexible display panel 200, which is being moved to the main roller 110 by the link drive unit 120, may be wound along the outer surface of the main roller 110 by rotation of the main roller 110.

The body 100 may further include a control panel 160 for controlling the link drive unit 120. The control panel 160 may be located on the back surface of the body 100.

The flexible display panel 200 may be a flexible display panel that serves to display an image. For example, the flexible display panel 200 may include a first flexible board 201 and a second flexible board 202 bonded to the first flexible board 201. A thin-film transistor 203 and a light-emitting device 204 may be located between the first flexible board 201 and the second flexible board 202. The light emitting device 204 may include a lower emitting electrode 204a, an organic light emitting layer 204b and an upper emitting electrode 204c. For example, the flexible display panel 200 may be an Organic Light-Emitting Display (OLED) panel. The flexible display may further include an over coat layer 205 between the thin film transistor 203 and the light emitting device 204, a bank insulating layer 206 covering an edge of the lower emitting electrode 204a, an upper protective layer 207 on the light emitting device 204, and an adhesive layer 208 between the upper substrate 202 and the upper protective layer 207.

The link assemblies 300 may be connected to the link drive unit 120. The link assemblies 300 may be moved and rotated by the link drive unit 120 so as to move the upper end of the flexible display panel 200 upward or downward. For example, the link assemblies 300 may connect between the link drive unit 120 and the upper end of the flexible display panel 200.

The link assemblies 300 may be disposed on the back surface of the flexible display panel 200. The rollable display device according to the embodiment of the present invention may further include a back cover 600 for hiding the operation of the link assemblies 300. The link assemblies 300 may operate between the flexible display panel 200 and the back cover 600.

The back cover 600 is a flexible material that can also be wound on the main roller 110 as the flexible display panel 200 is wound around on the main roller 110. The back cover 600 conceals the rear surface of the flexible display panel 200 as well as the link assemblies 300.

Figure 2A:
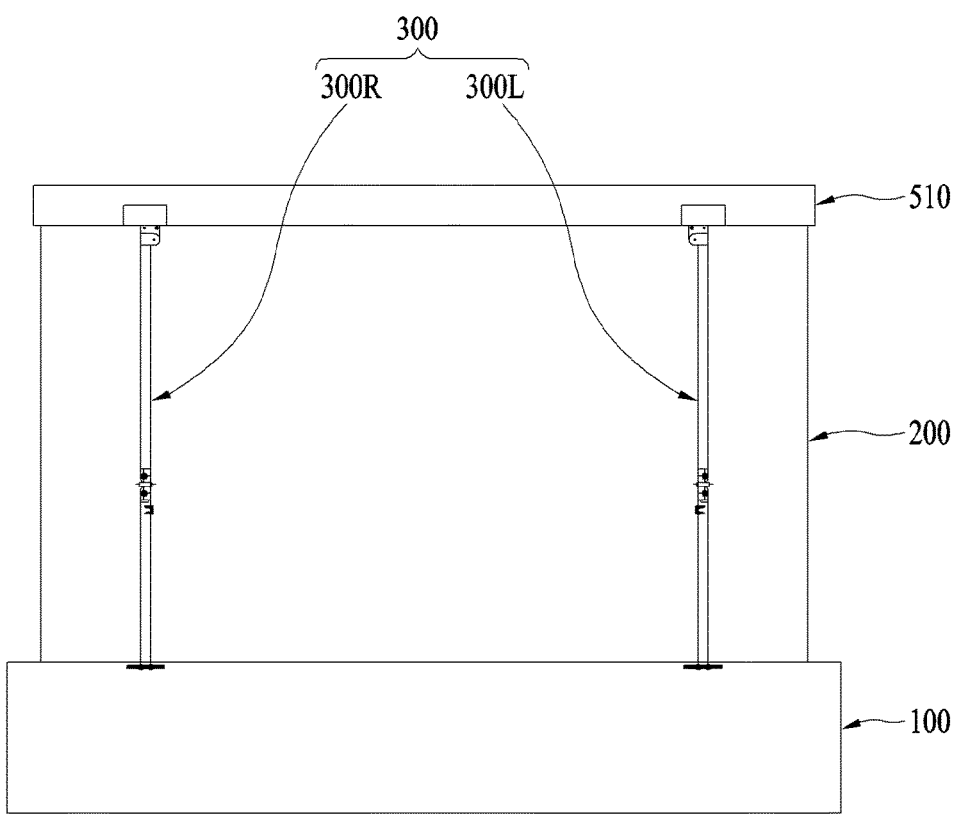
FIG. 2A is a rear view illustrating the rear of the rollable display device with a back cover removed, according to the embodiment of the present invention.
Figure 2B:
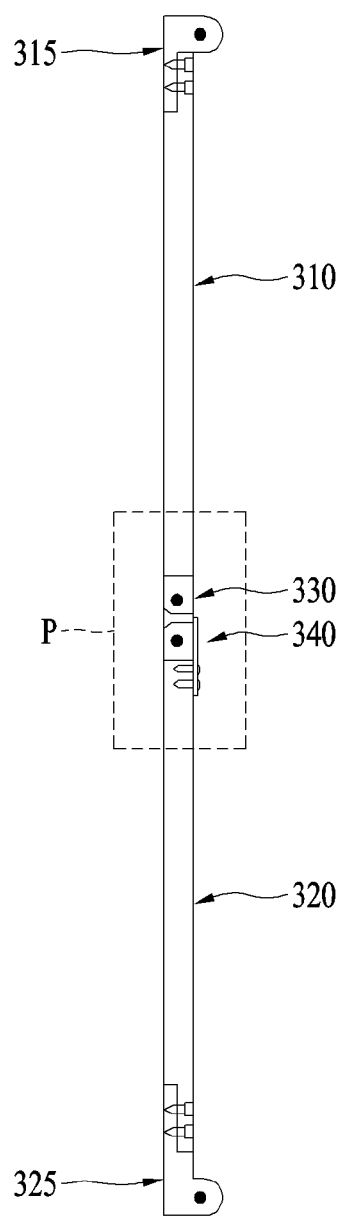
FIG. 2B is a view illustrating a link assembly of the rollable display device when a flexible display panel is completely unrolled, according to one embodiment of the present invention.

FIG. 2A is a view illustrating the back surface of the rollable display device with the back cover 600 removed, according to one embodiment of the present invention. FIG. 2B is a view illustrating a first link assembly 300R of the rollable display device when the flexible display panel is completely unrolled, according to one embodiment of the present invention.

Referring to FIGS. 1A, 1B, 2A and 2B, the link assemblies 300 of the rollable display device according to the embodiment of the present invention may include a first link assembly 300R and a second link assembly 300L.

The first link assembly 300R and the second link assembly 300L may be located at opposite sides of the flexible display panel 200. For example, as illustrated in FIG. 1B, the first link assembly 300R may be located close to the right edge of the back surface of the flexible display panel 200 and the second link assembly 300L may be located close to the left edge of the back surface of the flexible display panel 200.

The rollable display device according to the embodiment of the present invention includes the link assembly 300, which has an I-shaped form when the flexible display panel 200 is completely unrolled. As such, the rollable display device according to the embodiment of the present invention may obviate a separate structure for the side surfaces of the rollable display device. Accordingly, in the rollable display device according to the embodiment of the present invention, a side surface portion of the rollable display device may become thin.

The first link assembly 300R may include an upper link frame 310, a lower link frame 320, a center link connectors 330, and an elastic plate 340. The second link assembly 300L may have the same configuration as the first link assembly 300R but in a symmetrical shape.

In the rollable display device according to the embodiment of the present invention, the first link assembly 300R and the second link assembly 300L are described as being symmetrical to each other. However, in the rollable display device according to another embodiment of the present invention, the second link assembly 300L may be same shape as the first link assembly 300R. For example, in the rollable display device according to another embodiment of the present invention, the first link assembly 300R and the second link assembly 300L may be rotated in the same direction by the link drive unit 120.

The lower link frame 320 may connect the link drive unit 120 and the center link connectors 330. The lower link frame 320 may include a lower end connected to the link drive unit 120. For example, the lower link frame 320 may further include a lower-end link bracket 325 for connection with the link drive unit 120.

The lower link frame 320 may be rotated by the link drive unit 120. The link drive unit 120 may rotate the lower link frame 320 on the back surface of the flexible display panel 200 via the lower-end link bracket 325. For example, when the completely unrolled flexible display panel 200 is rolled up, the upper end of the lower link frame 320 may be moved to the center of the flexible display panel 200 by the link drive unit 120.

The upper link frame 310 may connect the upper end of the flexible display panel 200 and the center link connectors 330. The upper link frame 310 may include an upper end connected to the upper end of the flexible display panel 200. For example, the upper link frame 310 may include an upper-end link bracket 315 for connection with the upper end of the flexible display panel 200.

Figure 3A:
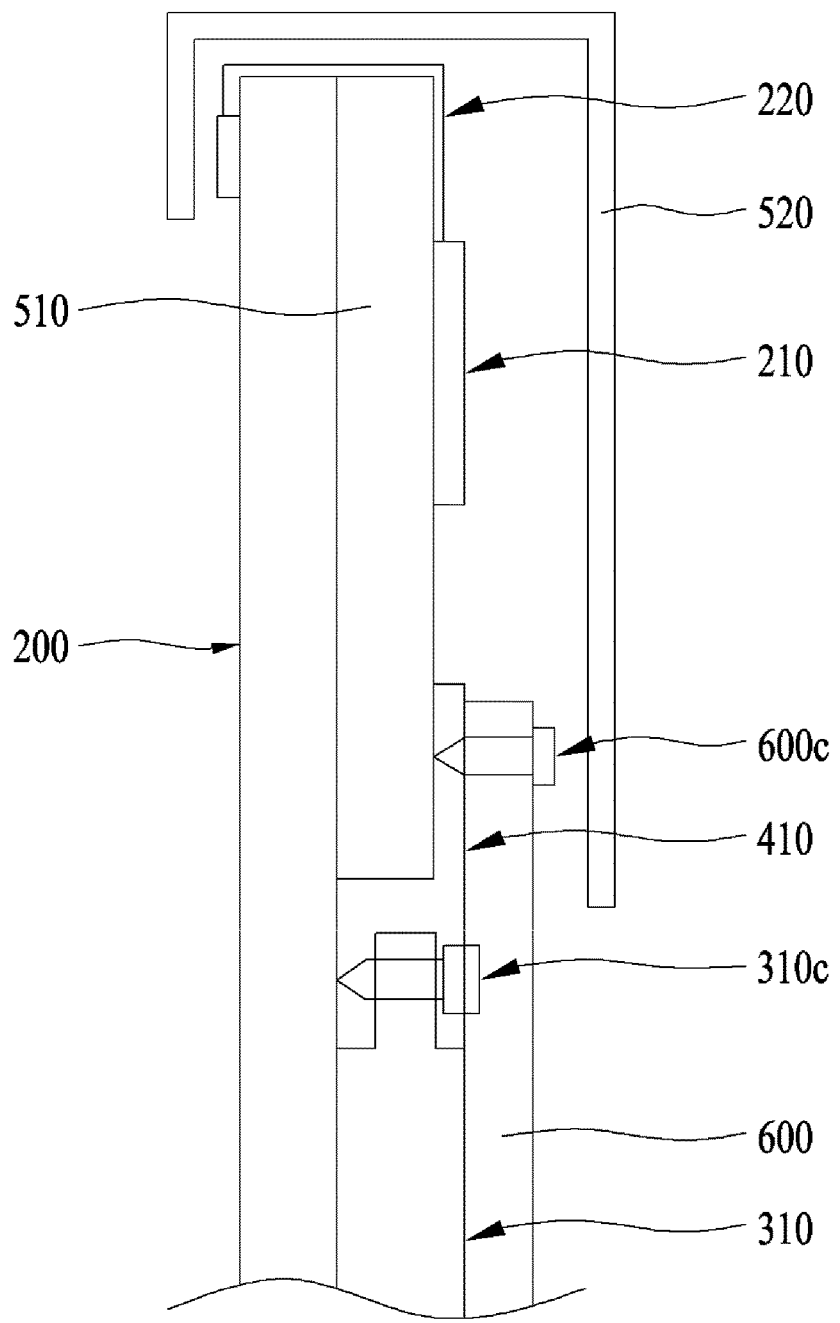
FIGS. 3A and 3B are views illustrating the connection relationship between an upper link frame and the upper end of the flexible display panel in the rollable display device, according to the embodiment of the present invention.
Figure 3B:
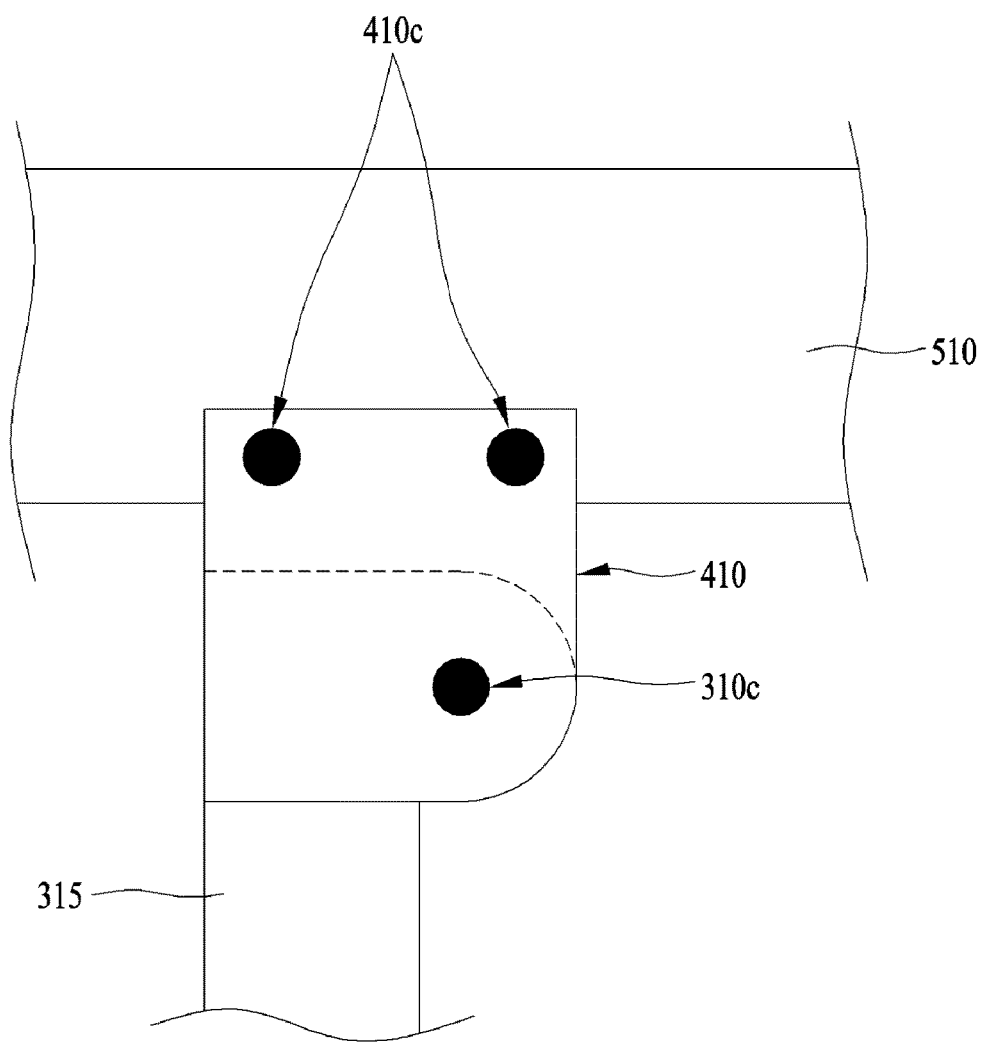

FIGS. 3A and 3B are views illustrating the connective relationships between the upper link frame 310 and the upper end of the flexible display panel 200 in the rollable display device, according to one embodiment of the present invention.

Referring to FIGS. 1A, 1B, 3A and 3B, the rollable display device according to the embodiment of the present invention may further include an upper holder 510 disposed on the upper end of the back surface of the flexible display panel 200, and a holder bracket 410 disposed between the upper holder 410 and the upper link frame 310.

The holder bracket 410 may be fixed to the upper holder 510 by a holder fixing pin 410c (as shown in FIG. 3B). The back cover 600 may cover the holder bracket 410. For example, the upper end of the back cover 600 may be coupled to the upper holder 510 by a cover fixing pin 600c.

The back cover 600 may move upward or downward along with the flexible display panel 200. The back cover 600 may be accommodated in the body 100. For example, the body 100 may further include a cover roller 170, around which the back cover 600 is wound, and an elastic member for rotating the cover roller 170.

The upper end of the flexible display panel 200 may move upward or downward along with the upper holder 510. For example, the flexible display panel 200 may hanged on the upper holder 510 using a connection member 220. The connection member 220 may be connected to a circuit board 210, which serves to transmit a drive signal and a voltage signal to a display area. For example, the connection member 220 may include a flexible printed circuit board (FPCB) or a tape carrier package (TCP). The rollable display device according to the embodiment of the present invention may further include an upper cap 520 for covering the connection member 220 and the upper holder 510.

In the rollable display device according to the embodiment of the present invention, the back cover 600 is fixed to the holder bracket 410. However, in the rollable display device according to another embodiment of the present invention, the back cover 600 may be fixed to the upper holder 510 or the upper cap 520.

The upper-end link bracket 315 of the upper link frame 310 may be coupled to the holder bracket 410 by an upper-end fixing pin 310c. The lower end of the upper link frame 310 may rotate to the center of the flexible display panel 200 about the upper-end fixing pin 310c.

Figure 4A:
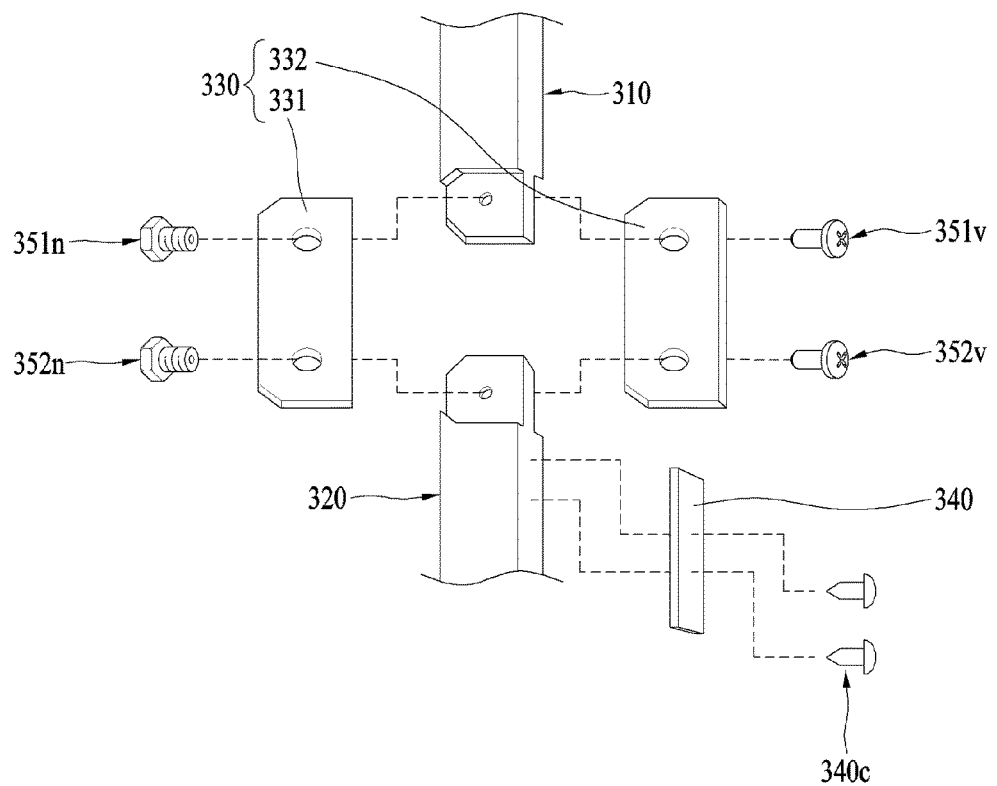
FIG. 4A is an exploded view of region P, illustrated in FIG. 2, according to one embodiment.
Figure 4B:
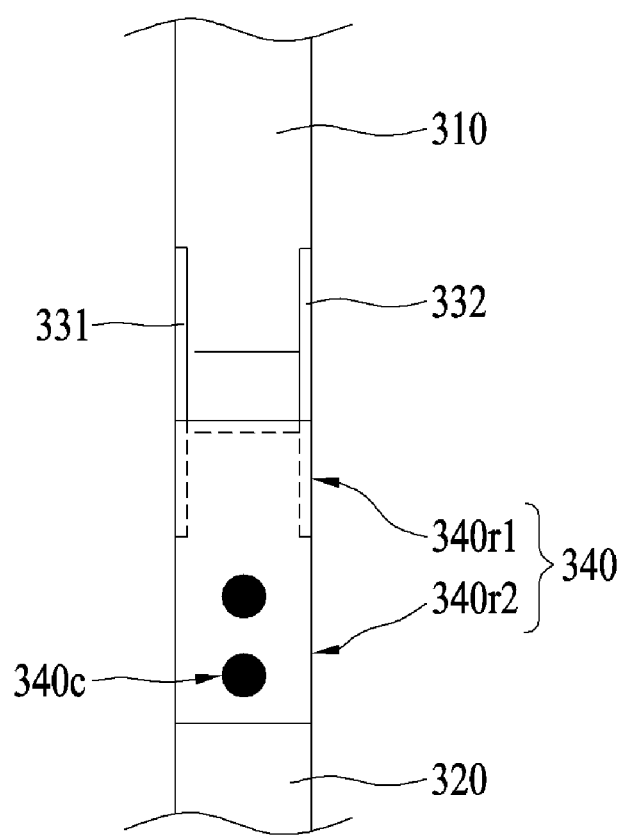
FIG. 4B is a view illustrating the region P, illustrated in FIG. 2 viewed from a direction opposite to the direction in which the link assembly is rotated, according to one embodiment.

FIG. 4A is an exploded view of region P, illustrated in FIG. 2, according to one embodiment. FIG. 4b is a view illustrating the region P, illustrated in FIG. 2, viewed from the center of the flexible display panel 200, according to one embodiment.

Referring to FIGS. 2, 4A and 4B, the center link connectors 330 of the rollable display device according to the embodiment of the present invention may be independently coupled to the lower end of the upper link frame 310 and the upper end of the lower link frame 320. For example, the lower end of the upper link frame 310 may be coupled to the center link connector 300 by an upper connection bolt 351$v$ and an upper connection nut 351$n$. The upper end of the lower link frame 320 may be coupled to the center link connectors 330 by a lower connection bolt 352$v$ and a lower connection nut 352$n$. The lower connection bolt 352$v$ and the lower connection nut 352$n$ may be located lower than the upper connection bolt 351$v$ and the upper connection nut 351$n$.

In the rollable display device according to the embodiment of the present invention, the upper link frame 310 and the lower link frame 320 may be coupled to the center link connectors 330 independently of each other. Accordingly, in the rollable display device according to the embodiment of the present invention, when the flexible display panel 200 is completely unrolled, each of the first link assembly 300R and the second link assembly 300L may become a vertically extending I-shaped form.

The center link connectors 330 may include a first connection plate 331 and a second connection plate 332, which are arranged parallel to each other. The first connection plate 331 and the second connection plate 332 may be parallel to the direction in which the upper link frame 310 and the lower link frame 320 are rotated. For example, the second connection plate 332 may be disposed between the flexible display panel 200 and the first connection plate 331.

The lower end of the upper link frame 310 and the upper end of the lower link frame 320 may be disposed between the first connection plate 331 and the second connection plate 332. Each of the lower end of the upper link frame 310 and the upper end of the lower link frame 320 between the first connection plate 331 and the second connection plate 332 may have a width smaller than the width of the other regions of the upper link frame and the lower link frame. For example, the outer surfaces of the first connection plate 331 and the second connection plate 332 may be vertically aligned with the side surfaces of the upper link frame 310 and the side surfaces of the lower link frame 320.

In the rollable display device according to the embodiment of the present invention, the lower end of the upper link frame 310 and the upper end of the lower link frame 320 between the first connection plate 331 and the second connection plate 332 of the center link connectors 330 have a width smaller than the width of the other regions of the first connection plate 331 and the second connection plate 332. As such, the rollable display device according to the embodiment of the present invention may minimize the space for operating the link assemblies 300. Accordingly, in the rollable display device according to the embodiment of the present invention, a side surface portion of the rollable display device may be slim.

The elastic plate 340 may be fixed to the lower link frame 320 by a plate fixing pin 340c. Assuming that the lower link frame 320 moves in a first direction by the relative rotation between the lower link frame 320 and the center link connector 330 during a rolling operation, the elastic plate 340 may be disposed on the surface of the lower link frame 320 that faces a second direction opposite to the first direction. For example, the elastic plate 340 may be fixed on the surface of the lower link frame 320, which faces the center of the flexible display panel 200.

The elastic plate 340 may extend to the upper end of the lower link frame 320. For example, when the flexible display panel 200 is completely unrolled, the upper end of the elastic plate 340 may be located on the surfaces of the first connection plate 331 and the second connection plate 332, which face the second direction. When the flexible display panel 200 is completely unrolled, the upper end of the elastic plate 340 may be higher than the lower end of the center link connectors 330. When the flexible display panel 200 is completely unrolled, the upper end of the elastic plate 340 may be lower than the lower end of the upper link frame 310.

The elastic plate 340 may be in contact with the surface of the lower link frame 320. When the flexible display panel 200 is completely unrolled, the elastic plate 340 may be in contact with the surface of the center link connectors 330. For example, when the flexible display panel is completely unrolled, the elastic plate 340 may include a first region 340r1, which is in contact with the first connection plate 331 and the second connection plate 332, and a second region 340r2, which is in contact with the lower link frame 320.

The elastic plate 340 may include an elastic material. For example, the elastic plate 340 may include a leaf spring.

Figure 5A:
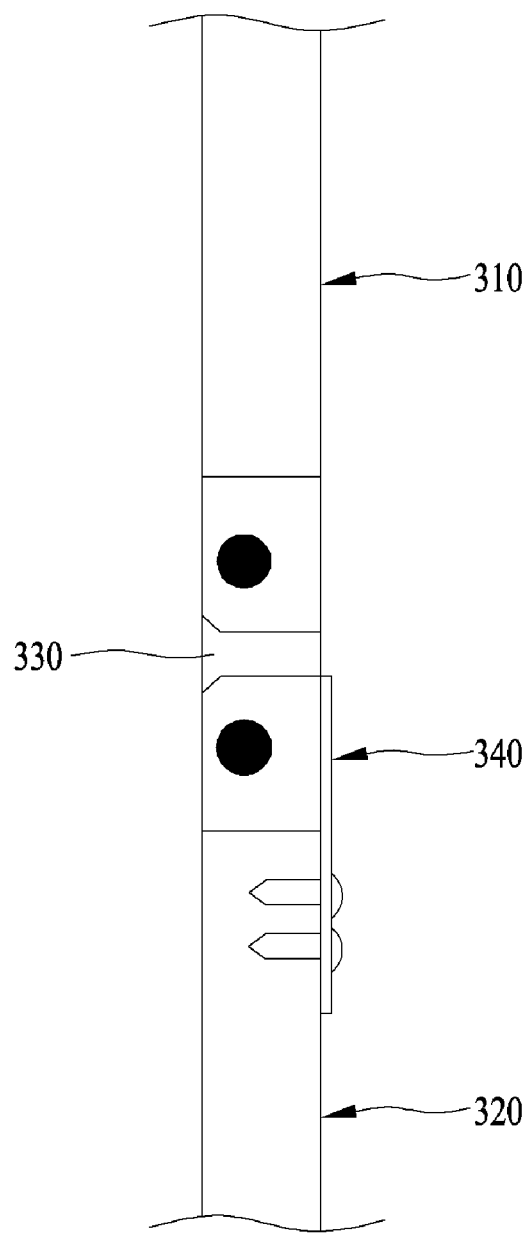
FIGS. 5A through 5C are views illustrating the sequence of operation of the link assembly as the flexible display panel in the rollable display device is rolled up, according to one embodiment of the present invention.
Figure 5B:
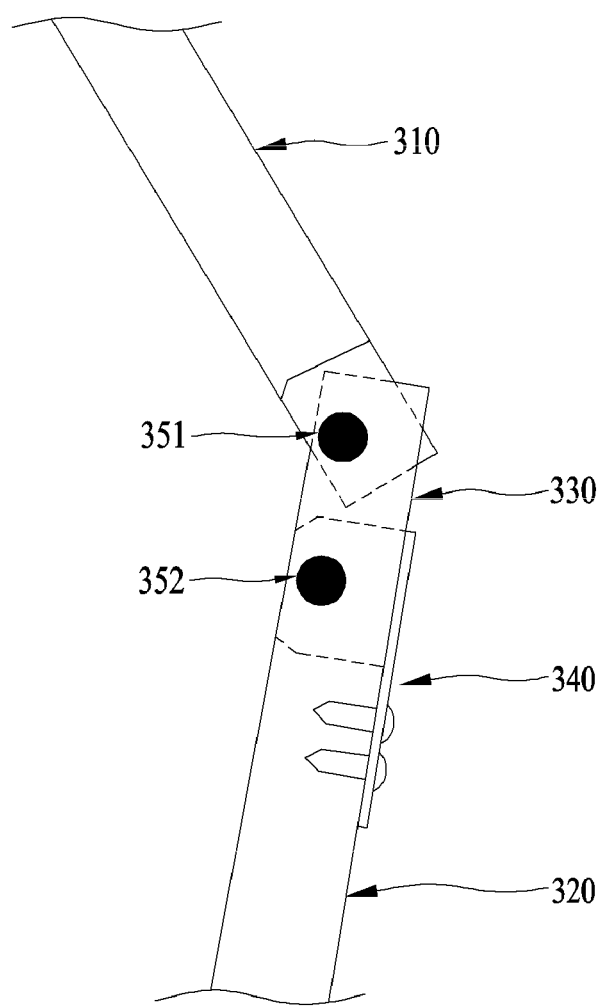
Figure 5C:
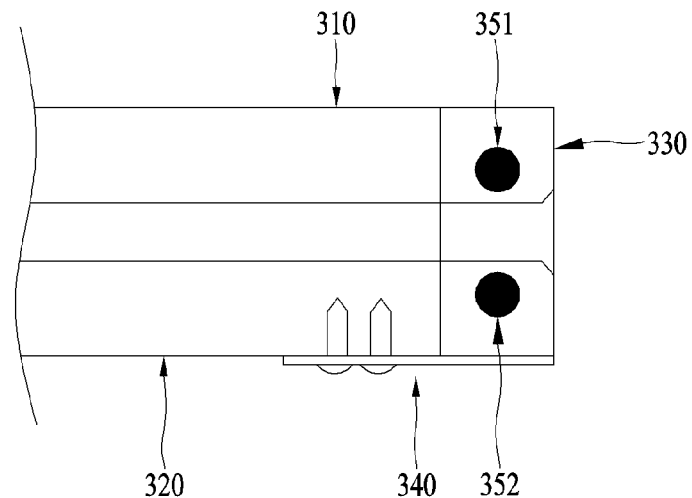

FIGS. 5A through 5C are views illustrating the sequence of operation of the upper link frame 310 and the lower link frame 320 when the flexible display panel 200 of the rollable display device is rolled from an unrolled state.

As illustrated in FIGS. 1A, 1B and 5A, in the state where the flexible display panel 200 is completely unrolled, the upper link frame 310 may be vertically aligned with the lower link frame 320. In this state, the center link connectors 330 may be located between the upper link frame 310 and the lower link frame 320.

As illustrated in FIG. 5B, a step of rolling the flexible display panel 200 may include a step of rotating the upper end of the lower link frame 320 by the link drive unit 120. The upper end of the lower link frame 320 may be coupled to the center link connectors 330 by a lower connection member 352 including the lower connection bolt and the lower connection nut. The elastic plate 340 fixed to the lower link frame 320 may be in contact with the center link connectors 330 in a direction opposite to the direction of the rolling operation. Thus, the rotation of the center link connectors 330 relative to the lower connection member 352 may be restrained by the elastic plate 340. That is, the elastic plate 340 may initially prevent the center link connectors 330 from rotating relative to a lower connection member 352 by exerting resilient force to the center link connectors 330. In both the first link assembly 300R and the second link assembly 300L, the center link connectors 330 cause the upper connection member 310 and the center link connectors 330 to make relative rotation before the lower connection member 320 makes rotation relative to the center link connectors 330. That is, the center link connector 330 rotates relative to the lower link frame 320 after rotation of the upper link frame 310 relative to the center link connector 330 is completed during the rolling operation of the flexible display panel 200.

Therefore, the rollable display device may maintain the balanced operations of the first link assembly 300R and the second link assembly 300L during rolling operation. For example, in the rollable display device according to the embodiment of the present invention, the first link assembly 300R and the second link assembly 300L may not cause the center link connectors 330 thereof to rotate about different connection members 351 and 352. Accordingly, the tilting of the flexible display panel 200 due to the unbalanced operations of the first link assembly 300R and the second link assembly 300L may be prevented.

As illustrated in FIG. 5C, after the flexible display panel 200 is completely rolled, the upper link frame 310 and the lower link frame 320 may become parallel to each other. In this state, the center link connectors 330 may be orthogonal to the upper link frame 310 and the lower link frame 320. As such, the rollable display device according to the embodiment of the present invention may reduce the space required for storage when the flexible display panel 200 is completely rolled.

If the link assemblies 300 are not bent consistently at both sides, damages to pixels may occur during the rolling or unrolling of the rollable display device due to uneven stress or strain applied to different parts of the flexible display panel 200. The rollable display device according to the embodiment of the present invention may prevent the unbalanced operation of the link assemblies 300 through the use of the elastic plate 340, thereby preventing da mage to the flexible display panel 200 and preventing the body 100 in which the flexible display panel 200 is accommodated from being broken.

Figure 6:
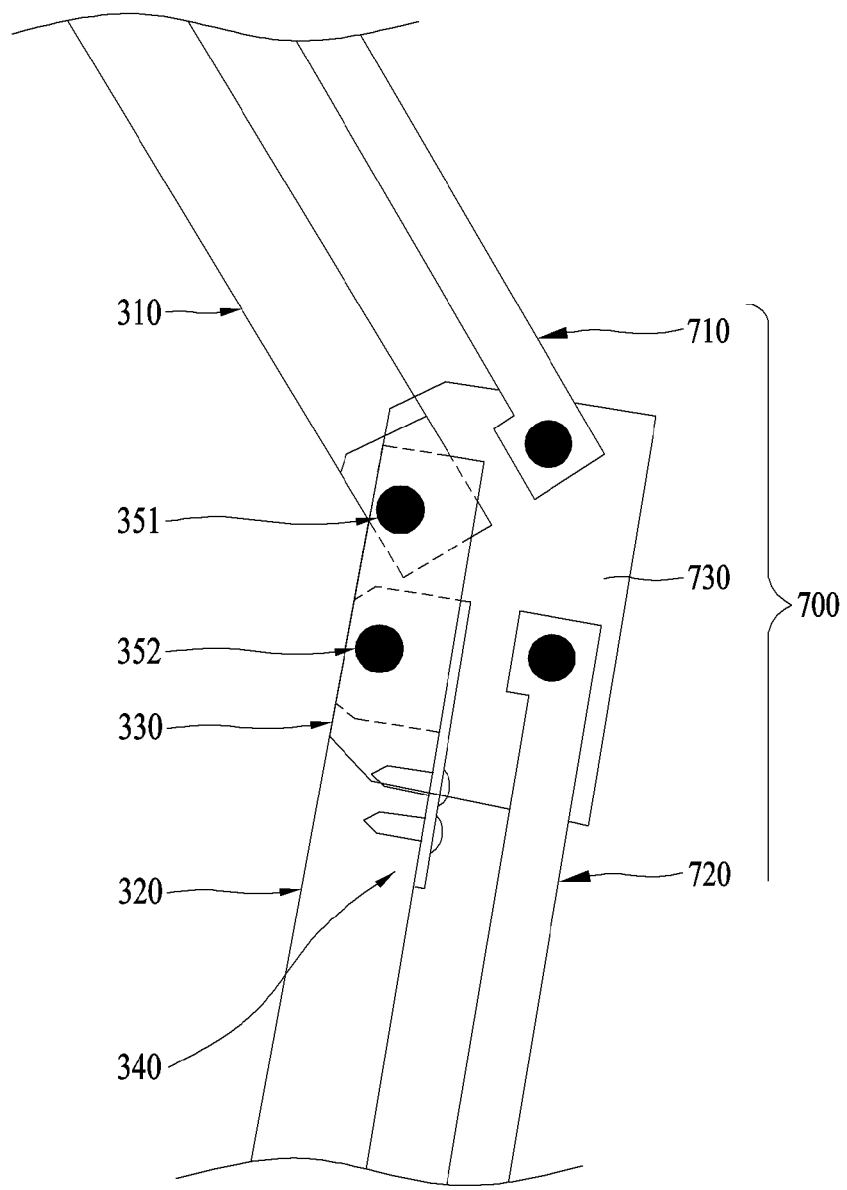
FIG. 6 is a detailed view illustrating the link assembly of the rollable display device, according to another embodiment of the present invention.

The rollable display device according to the embodiment of the present invention is described as including the body 100, the flexible display panel 200, and the link assemblies 300. However, as illustrated in FIG. 6, the rollable display device according to another embodiment of the present invention may further include a reinforcement assembly 700. The reinforcement assembly 700 may include an upper reinforcement frame 710, a lower reinforcement frame 720, and a center reinforcement connector 730. The upper reinforcement frame 710 may be parallel to the upper link frame 310. The lower reinforcement frame 720 may be parallel to the lower link frame 320. The lower end of the upper reinforcement frame 710 and the upper end of the lower reinforcement frame 720 may be independently coupled to the center reinforcement connector 730. The center reinforcement connector 730 may be coupled to the center link connectors 330. As such, the rollable display device according to another embodiment of the present invention may prevent the tilting of the flexible display panel due to the unbalanced operation of the link assemblies and may also prevent deformation of the link assemblies caused by external force.

Although in embodiments described above with reference to FIGS. 4A through 6 are described as having the elastic plate 340 fixed to the lower link frame 320, in other embodiments, the elastic plate 340 may instead be fixed to the upper link frame 310. In such embodiments, the center link connector 330 rotates relative to the upper link frame after rotation of the lower link frame relative to the center link connector is completed during the rolling operation of the flexible display panel 200.

In the rollable display device according to the embodiment of the present invention, the side surface of the upper link frame 310, which faces the center of the flexible display panel 200, is described as being spaced apart from the upper holder 510. However, as illustrated in FIGS. 7 and 8, in the rollable display device according to another embodiment of the present invention, the upper holder 510 may include holder position alignment members 511R and 511L, and the upper link frame 310 may include a link position alignment member 310RP or 310LP.

When the flexible display panel 200 is completely rolled up, the link position alignment members 310RP and 310LP may be engaged with the holder position alignment members 511R and 511L. For example, each of the holder position alignment members 511R and 511L may include a protrusion, which protrudes downward from a region thereof close to the upper holder 510, and each of the link position alignment members 310RP and 310LP may include a protrusion, which protrudes toward the center of the flexible display panel 200 from a region thereof distant from the flexible display panel 200. When the holder position alignment members 511R and 511L and the link position alignment members 310RP and 310LP are engaged with each other, each of the holder position alignment members 511R and 511L may be disposed between the flexible display panel 200 and a corresponding one of the link position alignment members 310RP and 310LP.

Figure 7:
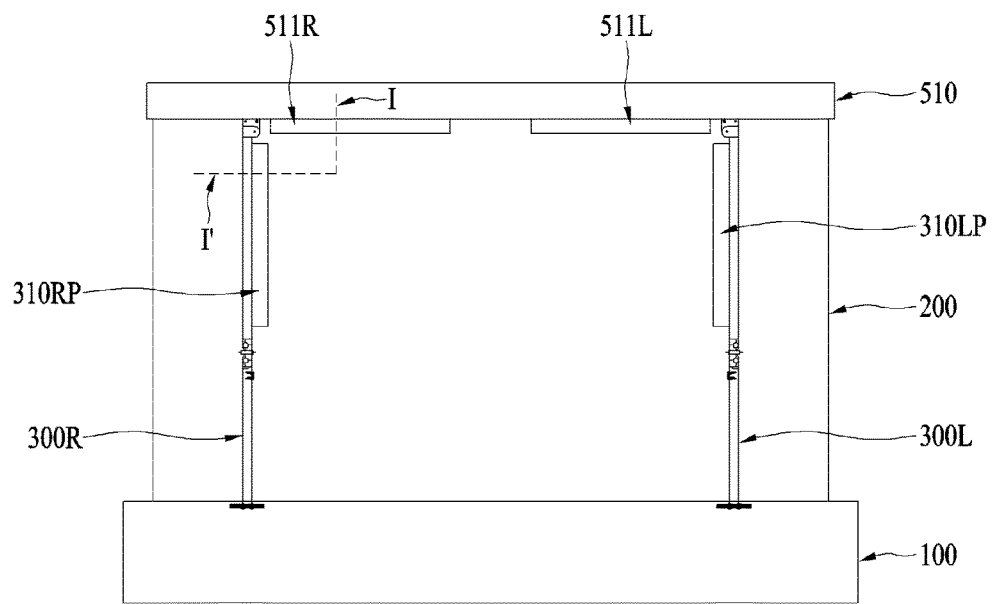
FIGS. 7 and 8 are views illustrating the rollable display device according to a further embodiment of the present invention.
Figure 8:
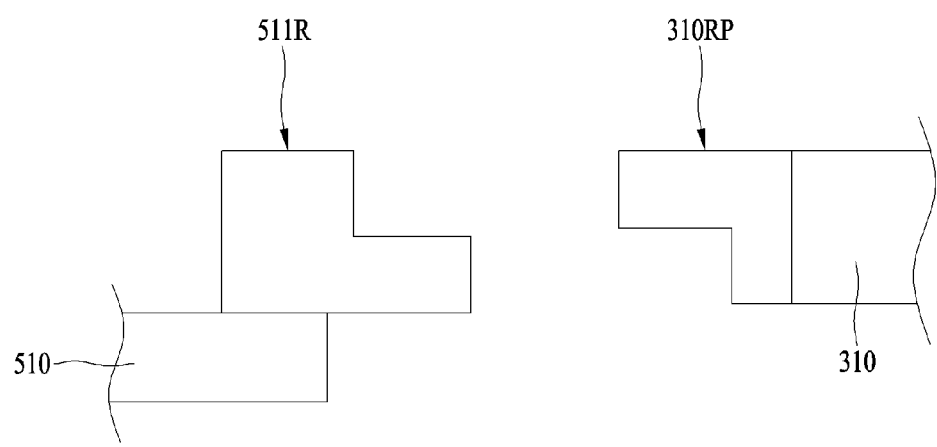
Figure 9A:
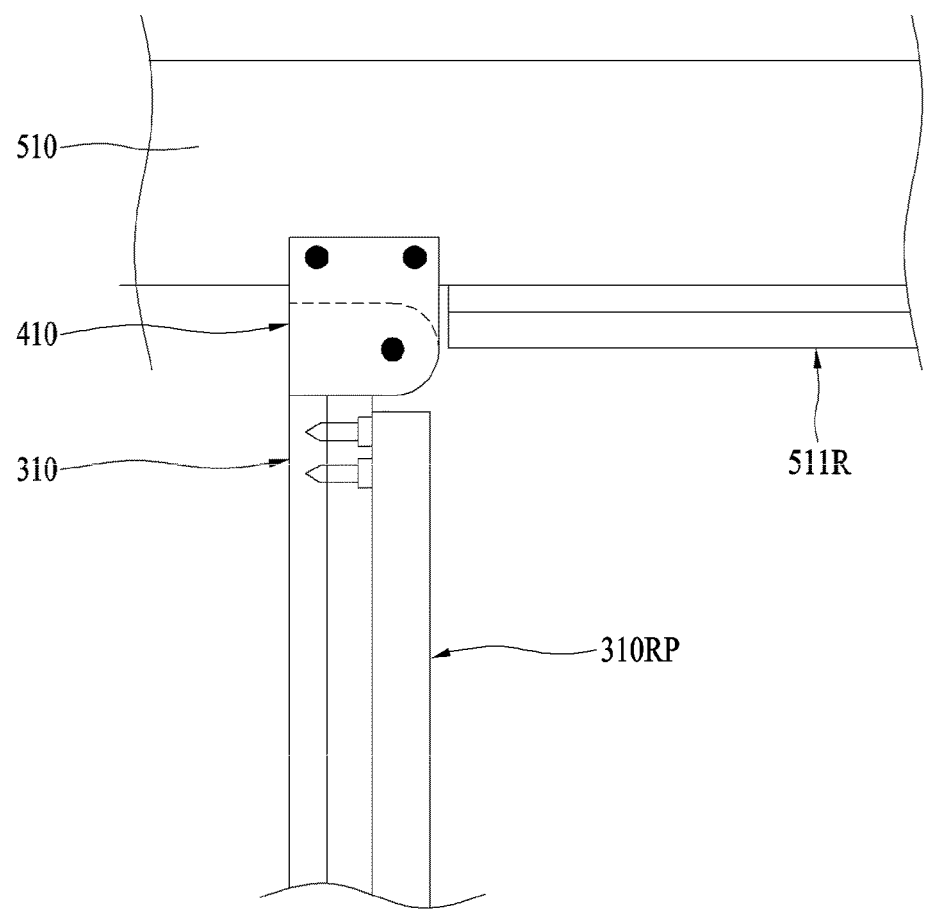
FIGS. 9A through 9C are views illustrating the sequence of operation of the rollable display device, according to the further embodiment of the present invention.
Figure 9B:
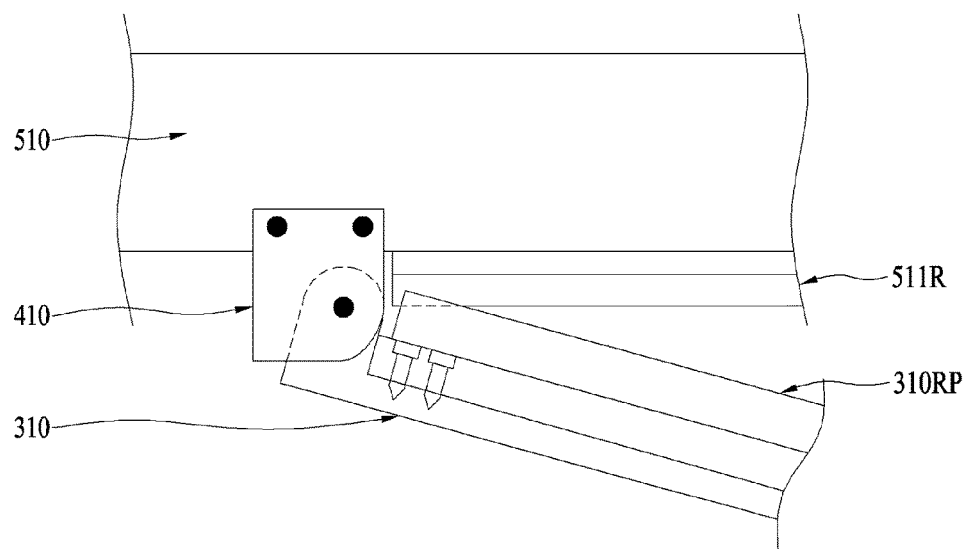
Figure 9C:
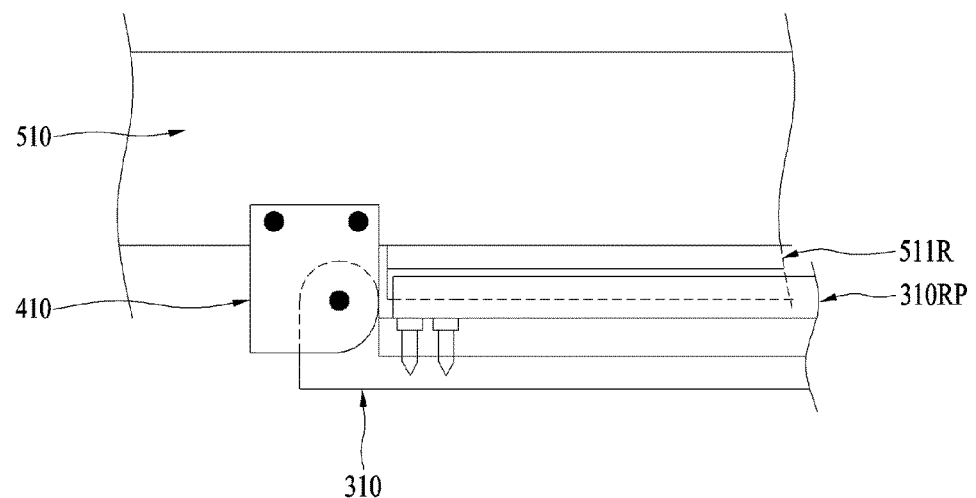

FIGS. 9A through 9C are views illustrating the sequential positions of the holder position alignment members 511R and 511L and the link position alignment members 310RP and 310LP when the flexible display panel 200 in the rollable display device illustrated in FIGS. 7 and 8 is rolled up in the completely unrolled state.

As illustrated in FIG. 9A, in the state where the flexible display panel 200 is completely unrolled, the holder position alignment members 511R and 511L and the link position alignment members 310RP and 310LP may be completely spaced apart from each other.

As illustrated in FIG. 9B, when the upper link frame 310 is rotated and the flexible display panel 200 is rolled up, the link position alignment member 310RP of the upper link frame 310 may move toward the holder position alignment member 511R. The holder position alignment member 511R may move to the space between the flexible display panel 200 and the link position alignment member 310RP.

As illustrated in FIG. 9C, when the flexible display panel 200 is completely rolled, the link position alignment member 310RP and the holder position alignment member 511R may be located parallel to each other. That is, in the rollable display device according to the embodiment of the present invention, the area over which the link position alignment member 310RP and the holder position alignment member 511R are engaged with each other may increase as the flexible display panel 200 is rolled up. The engagement of the link position alignment member 310RP and the holder position alignment member 511R may prevent the flexible display panel 200 from being bent rearward by restoration force when the flexible display panel 200 is rolled up.

In conclusion, the rollable display device according to the embodiment of the present invention may prevent the flexible display panel 200 from being bent rearward while being rolled up through the use of the link position alignment member 310RP and the holder position alignment member 511R, which are shaped so as to engage with each other, thereby ensuring the smooth rolling of the flexible display panel.

As is apparent from the above description, a rollable display device according to the present invention may maintain the balance of operation of two link assemblies that are used to move a flexible display panel. As such, the rollable display device according to the present invention may prevent the flexible display panel from being tilted during a rolling or unrolling operation thereof. Accordingly, the rollable display device according to the present invention may achieve enhanced safety and increased product lifespan.

What is claimed is:

1. A rollable display device comprising:
    a body including a main roller and a link drive unit;
    a flexible display panel including a lower end coupled to the main roller, the flexible display panel wound around the main roller; and
    two link assemblies, each of the two link assemblies including an upper link frame having an upper end connected to an upper end of the flexible display panel, a lower link frame having a lower end connected to the link drive unit, a center link connector, and an elastic plate fixed to the lower link frame, a lower end of the upper link frame and an upper end of the lower link frame coupled to the center link connector,
    wherein the center link connector includes a first connection plate disposed close to the flexible display panel, and a second connection plate disposed parallel to the first connection plate, and
    wherein the lower end of the upper link frame and the upper end of the lower link frame are disposed between the first connection plate and the second connection plate.

2. The rollable display device according to claim 1, wherein the elastic plate is disposed on a surface of the lower link frame of one of the two link assemblies facing outward away from the lower frame of the other of the two link assemblies, each of the two link assemblies collapsing inward as the lower link frame is rotated by the link drive unit to roll the flexible display panel onto the main roller.

3. The rollable display device according to claim 1, wherein a surface of the center link connector facing outward is in contact with the elastic plate when the flexible display panel is completely unrolled.

4. The rollable display device according to claim 1, wherein the upper end of the elastic plate is lower than the lower end of the upper link frame when the flexible display panel is completely unrolled.

5. The rollable display device according to claim 1, wherein the center link connector is shorter than the upper link frame and the lower link frame.

6. The rollable display device according to claim 5, wherein the lower end of the upper link frame and the upper end of the lower link frame between the first connection plate and the second connection plate have a width smaller than a width of the other regions of the upper link frame and the lower link frame.

7. The rollable display device according to claim 1, wherein each of the link assemblies further includes an upper reinforcement frame parallel to the upper link frame, a lower reinforcement frame parallel to the lower link frame, and a center reinforcement connector to which a lower end of the upper reinforcement frame and an upper end of the lower reinforcement frame are coupled independently of each other.

8. The rollable display device according to claim 7, wherein the center reinforcement connector is coupled to the center link connector.

9. The rollable display device according to claim 1, further comprising:
    an upper holder between the upper end of the flexible display panel and the upper end of the upper link frame; and
    a back cover including an upper end coupled to the upper holder,
    wherein the two link assemblies are disposed between the flexible display panel and the back cover.

10. The rollable display device according to claim 9, wherein the body further includes a cover roller, around which the back cover is wound.

11. The rollable display device according to claim 9, further comprising:
a first position alignment member on a lower end of the upper holder; and
a second position alignment member on the upper link frame,
wherein the second position alignment member engages with the first position alignment member when the flexible display panel is completely rolled.

12. The rollable display device according to claim 11, wherein the first position alignment member is between the flexible display panel and the second position alignment member when the first position alignment member engages with the second position alignment member.

13. The rollable display device according to claim 1, wherein the elastic plate includes a leaf spring.

14. A rollable display device, comprising:
a flexible display panel comprising pixels operated by transistors;
a body including a main roller onto which the flexible display panel is wound from a lower end of the flexible display panel; and
a pair of link assemblies between the body and an upper end of the flexible display panel, and configured to support the flexible display panel, each of the link assemblies comprising:
an upper link frame coupled to the upper end of the flexible display panel, the upper link frame rotatable relative to the upper end of the flexible display pane,
a lower link frame coupled between the body and the upper link frame, the lower link frame rotatable relative to the body and the upper link frame, and
a center link connector coupled to a lower end of the upper link frame and coupled to an upper end of the lower link frame,
wherein the center link connector includes a first connection plate disposed close to the flexible display panel, and a second connection plate disposed parallel to the first connection plate, and
wherein the lower end of the upper link frame and the upper end of the lower link frame are disposed between the first connection plate and the second connection plate.

15. The rollable display device of claim 14, wherein the upper link frame, and the lower link frame move parallel to a back surface of the flexible display panel during winding or unwinding of the flexible display panel.

16. The rollable display device of claim 14, wherein
the center link connector rotatably connects the upper link frame and a lower link frame, and
wherein the each of the link assemblies comprises an elastic plate coupled to the upper link frame or the lower link frame to exert resilient force to the center link connector to sequentially rotate the upper link frame and the lower link frame relative to the center link connector.

17. The rollable display device of claim 16, wherein during rolling of the flexible display panel onto the main roller, the center link connector starting to rotate relative to the lower link frame or the upper link after rotation of the upper link frame or the lower link relative to the center link connector is completed.

18. The rollable display of claim 16, wherein the elastic plate is attached to a surface of the upper link frame or the lower link frame and having a flat surface facing a side surface of the at least one center link connector when the rollable display is unrolled, the elastic plate exerting the resilient force to the center link connector by contacting the center link connector through the flat surface.

19. The rollable display of claim 18, wherein the center reinforcement connector is coupled to the center link connector.

20. The rollable display of claim 14, wherein each of the link assemblies further includes an upper reinforcement frame parallel to the upper link frame, a lower reinforcement frame parallel to the lower link frame, and a center reinforcement connector rotatably connecting the upper reinforcement frame and the lower reinforcement frame.

21. The rollable display of claim 14, further comprising a back cover covering at least a portion of a back surface of the flexible display panel and the pair of the link assemblies.

22. The rollable display of claim 21, wherein the body further includes a cover roller configured to roll or unroll the back cover.

23. The rollable display of claim 21, further comprising:
an upper holder extending along the upper end of the flexible display panel; and
a holder bracket between the upper holder and the upper link frame, the upper link frame rotatably connected to the holder bracket.

24. The rollable display device according to claim 23, further comprising:
a first position alignment member on a lower end of the upper holder; and
a second position alignment member on the upper link frame,
wherein the second position alignment member engages with the first position alignment member when the flexible display panel is rolled.

25. The rollable display device according to claim 24, wherein the first position alignment member is disposed between the flexible display panel and the second position alignment member when the first position alignment member engages with the second position alignment member.

* * * * *